(12) United States Patent
Schatzeder et al.

(10) Patent No.: US 6,869,481 B2
(45) Date of Patent: Mar. 22, 2005

(54) METHOD AND DEVICE FOR REGULATING THE DIFFERENTIAL PRESSURE IN EPITAXY REACTORS

(75) Inventors: Anton Schatzeder, Schnaitsee (DE); Georg Brenninger, Oberbergkirchen (DE)

(73) Assignee: Siltronic AG, Munich (DE)

( * ) Notice: Subject to any disclaimer, the term of this patent is extended or adjusted under 35 U.S.C. 154(b) by 122 days.

(21) Appl. No.: 10/330,816

(22) Filed: Dec. 27, 2002

(65) Prior Publication Data

US 2003/0140852 A1 Jul. 31, 2003

(30) Foreign Application Priority Data

Jan. 31, 2002 (DE) .......................................... 102 03 833

(51) Int. Cl.⁷ ............................................. C30B 25/12
(52) U.S. Cl. ........................... 117/89; 117/93; 117/102; 117/105
(58) Field of Search .......................... 117/89, 93, 102, 117/105

(56) References Cited

U.S. PATENT DOCUMENTS

| | | | |
|---|---|---|---|
| 5,789,309 | A | 8/1998 | Hellwig |
| 5,997,588 | A | 12/1999 | Goodwin et al. |
| 6,086,678 | A | 7/2000 | Wilson et al. |
| 6,161,311 | A | 12/2000 | Doley et al. |
| 2001/0035530 | A1 | 11/2001 | Udagawa |

FOREIGN PATENT DOCUMENTS

| | | |
|---|---|---|
| DE | 197 28 310 | 1/1998 |
| JP | 5-21390 | 1/1993 |
| JP | 5-102088 | 4/1993 |
| JP | 8-213318 | 8/1996 |

OTHER PUBLICATIONS

English Patent Abstract of Japan Corresponding to JP8–213318.
English Machine Translationcorresponding to JP8–213318.
English Patent Abstract of Japan Corresponding to JP5–21390.
English Derwent Abstract AN 1998–064569 Corresponding to DE19728310.
English Patent Abstract of Japan Corresponding to JP5–102088.

*Primary Examiner*—Felisa Hiteshew
(74) *Attorney, Agent, or Firm*—Collard & Roe, P.C.

(57) ABSTRACT

A method and a device for regulating a pressure in an epitaxy reactor, wherein the epitaxy reactor has a wafer handling chamber WHC, a process chamber PC, and a gate valve GV connecting the two chambers. The wafer handling chamber is continuously purged with inert gas. The pressure difference between the wafer handling chamber and the process chamber is measured, and the resulting measurement signal is used in a control circuit to regulate the pressure in the wafer handling chamber. In this case the pressure in the wafer handling chamber is reduced if the pressure difference is above a predetermined value and the pressure in the wafer handling chamber is increased if the pressure difference is below a predetermined value. The predetermined pressure difference is defined as a pressure being between 5 and 500 PA. The WHC and the PC each have a gas discharge line and a gas input line. There is a differential pressure sensor for measuring the pressure difference between the chambers and control unit for regulating the pressure in the WHC.

10 Claims, 3 Drawing Sheets

METHOD AND DEVICE FOR REGULATING THE DIFFERENTIAL PRESSURE IN EPITAXY REACTORS

BACKGROUND

The invention relates to a method and a device for regulating a pressure difference between a wafer handling chamber and a process chamber of an epitaxy reactor.

Epitaxy reactors are used to produce epitaxial layers on single-crystal materials, for example for producing an epitaxial coating on semiconductor wafers, particularly silicon wafers. A reaction medium, generally a reaction gas, reacts on a surface which is to be coated to deposit further material in single crystal form, which generally also forms gaseous byproducts.

The epitaxy reactors which are used, substantially comprise a wafer handling chamber (WHC), a process chamber (PC) and a gas-supply system. The wafer handling chamber forms a connection between the process chamber and the environment, generally a clean room. The wafer handling chamber is continuously purged with inert gas, such as nitrogen, to keep it clean.

The workpieces, or semiconductor wafers, which are to be epitaxially coated, are transferred from a clean room via a lock into the wafer handling chamber, where these workpieces may be temporarily stored. These workpieces are then generally transferred individually, via a robot arm, through a gate valve (GV) into the process chamber. Then, the gate valve is closed and the epitaxial coating process is performed. During the epitaxial coating process, various gases, including at least a carrier gas and a reaction gas, are supplied via a gas supply and passed in laminar flow at high temperatures over the semiconductor wafer.

During this process, the reaction gas reacts on the wafer surface. Excess gas and gaseous byproducts are discharged via an exhaust and an off-gas scrubber.

After the process has ended, the gate valve is opened again, and the wafer is transferred back into the wafer handling chamber and is replaced by an untreated wafer.

A crucial factor regarding the quality of the epitaxially coated semiconductor wafers is the number of unwanted particles which settle on the wafers. To reduce the number of particles, it is crucial for there to be no gas turbulence or pressure surges which activate inactive particles lying, for example, at the bottom of the wafer handling chamber.

If a wafer is being conveyed from the wafer handling chamber into the process chamber, the connection between the two chambers, through the gate valve, has to be opened. It is crucial for the two chambers to be at approximately the same pressure level before the gate valve is opened. Otherwise, a sudden pressure compensation may cause particles to be swirled up.

However, the pressure in the wafer handling chamber must always be at a slightly higher level than the pressure in the process chamber, so that when the gate valve is opened there is a gentle flow in the direction of the process chamber. The pressure differential is provided to prevent substances such as gases or particles from being able to move from the gas outlet of the process chamber back into the process chamber, or from the process chamber into the wafer handling chamber.

While the wafer handling chamber can be kept at a constant pressure without problems, the pressure conditions in the process chamber are subject to considerable changes over the course of time. These changes are caused by the off-gas pipe being occupied, or by changes in the state of the off-gas scrubber.

The wafer handling chamber can now be kept at a constant pressure which is so high that this pressure is higher than the variable pressure in the process chamber. If there is a constant incoming flow of inert gas, the outgoing flow of inert gas from the wafer handling chamber can be regulated by a backpressure regulator so that the pressure in the wafer handling chamber remains constant. However, this so-called dynamic pressure regulation leads to a strong pressure surge, and therefore to turbulence when the gate valve is opened if the pressure in the process chamber is low at the time. A further drawback is the high inertia of the system, with the result that only slight pressure differences can be compensated for within a short time period. Regulation of the incoming flow of inert gas to the wafer handling chamber via the power of a delivery system also has the same drawbacks.

To regulate the incoming flow, a compensation line is provided between the wafer handling chamber and the process chamber, which can be opened using a valve. The wafer handling chamber can then be set to a relatively high, constant pressure as described above, wherein this constant pressure is always higher than the fluctuating pressure of the process chamber. Before the gate valve is opened, the valve of the compensation line is opened, so that the pressure in the two chambers can be matched in a regulated manner. However, this results in a relatively higher pressure gas stream being formed in the compensation line, and this in turn generates turbulence, with the associated risk of particles being activated. Moreover, this pipeline and the valve have been designed to be very small, to limit the gas stream and thereby avoid turbulence, leading to a relatively high inertia. Furthermore, when the compensation line is open, back-flows from the process chamber into the wafer handling chamber are possible, which is, as stated above, preferably to be avoided.

A further known possible solution consists in applying an additional pressure to the wafer handling chamber via a regulated inert gas purge shortly before the gate valve is opened, to prevent a gas stream from flowing from the process chamber into the wafer handling chamber. In this way, the wafer handling chamber can be kept at a low pressure throughout the majority of the time required for a process. This method, unlike the dynamic-pressure regulation, offers the possibility of discharging inert gas through an outlet valve, with the result that particles can escape from the wafer handling chamber without obstacle. However, this method also leads to considerable pressure fluctuations during the opening and closing of the gate valve. Therefore, it is impossible to prevent particles from being activated.

One object of the invention is to provide a system that ensures that when the gate valve is opened, gas does not flow back out of the off-gas system of the wafer handling chamber and gas does not flow out of the process chamber into the wafer handling chamber even with pressure fluctuations in the process chamber. Another object is to avoid a high pressure difference—even if only temporary—between the two chambers, which leads to considerable turbulence and therefore, to particles being activated when the gate valve is opened. Another object is to provide a system having a low inertia wherein the two chambers are completely separated with the gate valve closed.

The object is achieved by providing a method for regulating the pressure in an epitaxy reactor, which has a wafer handling chamber, a process chamber and a gate valve connecting the two chambers. The wafer handling chamber is continuously purged with inert gas, wherein the pressure difference between the wafer handling chamber and the process chamber is measured, and the resulting measurement signal is used in a control circuit to regulate the pressure in the wafer handling chamber. The pressure in the wafer handling chamber is reduced if the pressure difference is above a predetermined value. The pressure in the wafer handling chamber is increased if the pressure difference is below a predetermined value. With this method, the pre determined pressure difference, which is defined as the pressure in the wafer handling chamber—pressure of the process chamber which is between 5 and 500 Pa.

The method according to the invention makes it possible to maintain a constant pressure difference between the wafer handling chamber and the process chamber. Since the pressure difference is always kept constant by means of the regulation, even when the pressure in the process chamber fluctuates, it is possible to forego with a high excess pressure in the wafer handling chamber. Therefore, the set value for the pressure difference can be fixed between 5 and 500 Pa, but preferably between 10 and 100 Pa, according to the invention, depending on the pressure conditions prevailing in the process chamber. This defined, low pressure difference ensures a gentle stream of gas from the wafer handling chamber toward the process chamber when the gate valve is opened, whereas flows in the opposite direction are avoided. Since the pressure difference is very low, when the gate valve is opened, the gas turbulence with the associated risk of particles being activated, is minimized. Under these conditions, it is possible to dispense with a compensation line between the two chambers. The chambers always remain separated when the gate valve is closed. The pressure-difference stabilization according to the invention can be achieved over a relatively wide pressure range.

The object of the invention is also achieved by providing a device for regulating the pressure in an epitaxy reactor which has a wafer handling chamber, a process chamber, a gate valve connecting the two chambers and in each case, one gas feed line and one gas discharge line for each of the two chambers. This device has at least one pressure-measuring appliance for measuring the pressure difference between the chambers and a control unit or circuit for regulating the pressure in the wafer handling chamber.

BRIEF DESCRIPTION OF THE DRAWINGS

Other objects and features of the present invention will become apparent from the following detailed description considered in connection with the accompanying drawings which disclose at least one embodiment of the present invention. It should be understood, however, that the drawings are designed for the purpose of illustration only and not as a definition of the limits of the invention.

In the drawings, wherein similar reference characters denote similar elements throughout the several views.

DETAILED DESCRIPTION

Figure 1:
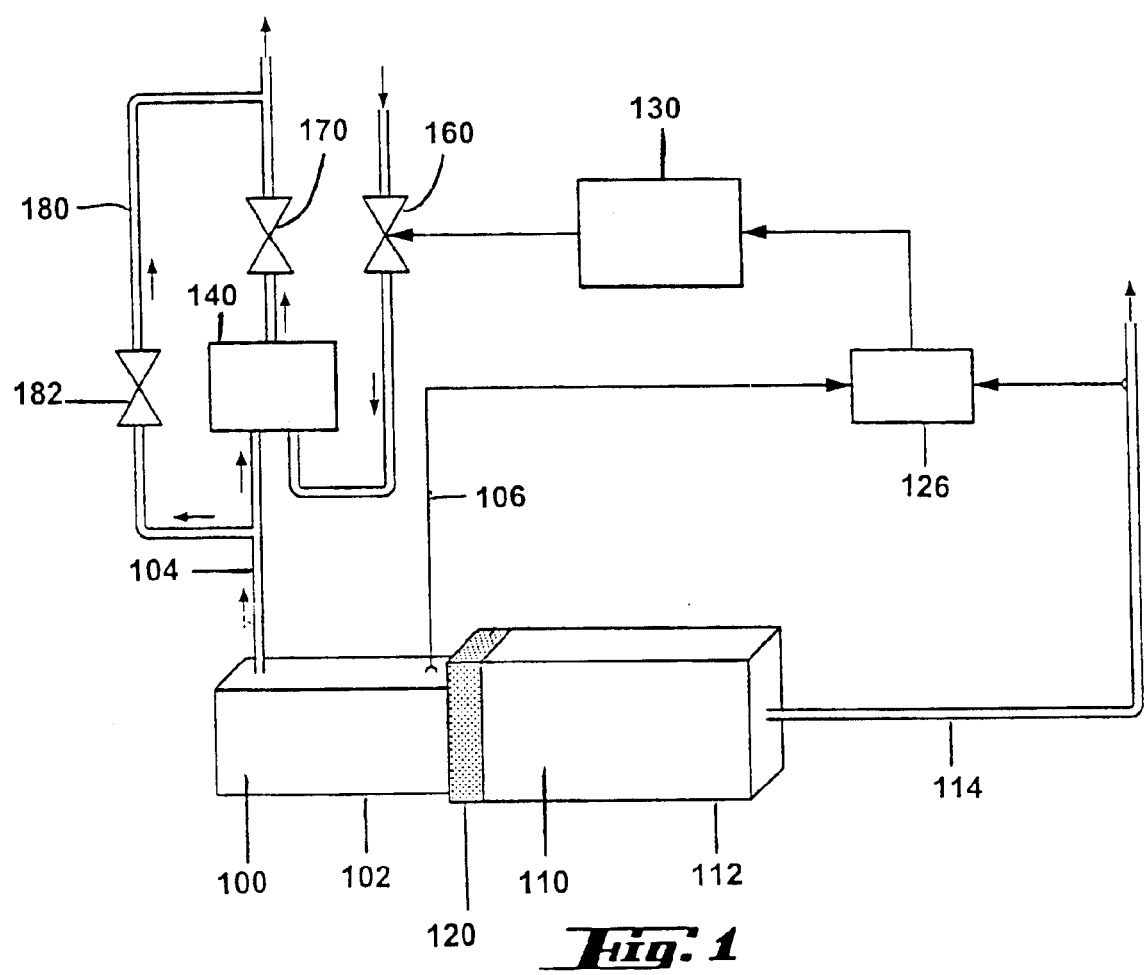
FIG. 1 shows a schematic block diagram of control circuit according to the invention for regulating a pressure difference between a wafer handling chamber and a process chamber of an epitaxy reactor.

Referring in detail to the drawings FIG. 1 shows the process for regulating a pressure difference between a wafer handling chamber and a process chamber.

The basis of the regulating method according to the invention is the measurement of the pressure difference between wafer handling chamber 100 and process chamber 110. In principle, the pressure in the two chambers can be measured using any two independent pressure-measuring appliances, and the pressure difference can then be determined by arithmetic means.

Figure 2:
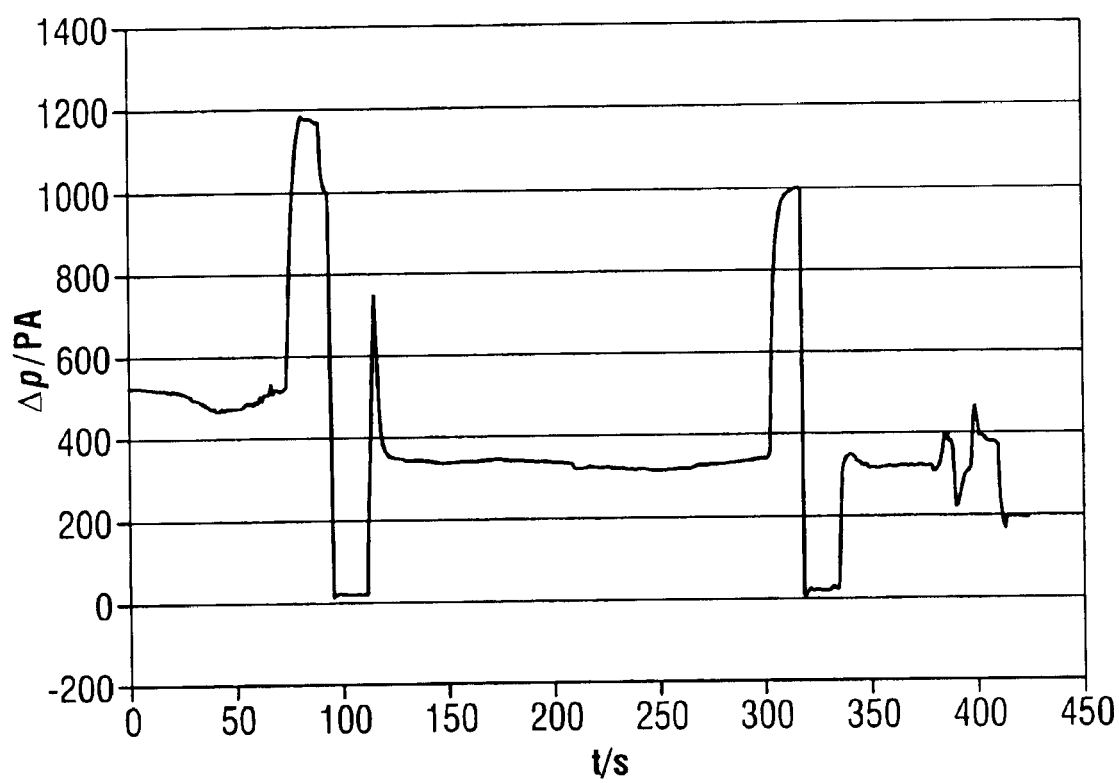
FIG. 2 illustrates a time curve of the pressure difference between the wafer handling chamber and the process chamber of an epitaxy reactor during an epitaxy process with a constant pressure in the wafer handling chamber.

However, in the context of the invention, it is preferable to use a commercially available differential-pressure sensor 126 connected to an output line 106 and handling chamber 100. The reference pressure used is the pressure prevailing in the process chamber 110 once the pressure prevailing in the off-gas line 114 is the same as in the process chamber. This pressure can also be used as reference pressure. This pressure difference is shown in FIG. 2. The pressure prevailing in the wafer handling chamber 110 is applied to the second pressure-measuring terminal. A differential-pressure sensor 126 preferably generates an electrical signal which corresponds to the differential pressure. This electrical signal is preferably amplified by an upstream amplifier and is then transmitted to a control unit or circuit 130.

Control unit 130 evaluates the signal obtained from differential-pressure sensor 126 or from the independent pressure-measuring appliances and compares it with a pre-set value corresponding to the predetermined set pressure difference. Finally, control unit 130 regulates the pressure prevailing in wafer handling chamber 100 so that the pressure in wafer handling chamber 100 is reduced if the pressure difference is above a predetermined value and the pressure in wafer handling chamber 100 is increased if the pressure difference is below a predetermined value. The pressure difference is defined as the pressure in the wafer handling chamber—pressure in the processing chamber.

According to the invention, the pressure in wafer handling chamber 100 is kept constant by regulating the outgoing flow of off-gas with an unregulated, preferably constant supply of inert gas. Control unit 130 regulates the capacity of a suction pump to adjust the pressure in the wafer handling chamber according to the predetermined set pressure difference.

The suction pump should be in a form of gas jet ventilator 140 which operates according to the venturi principle. The suction capacity thereof is regulated by a regulated inert-gas stream 150, preferably in a form of a regulated stream of nitrogen.

If the measured actual value of the pressure difference deviates downward, for example, if the pressure in wafer handling chamber 100 is too low, control unit 130 emits a signal to a regulating valve 160, which leads to a reduction in the flow of inert gas through regulating valve 160 and therefore to a reduction in the suction capacity of the gas jet ventilator or suction pump 140. As a result, the pressure in wafer handling chamber 100 rises. If the measured actual pressure difference is too high, the flow of inert gas through the regulating valve, and therefore the suction capacity of the gas jet ventilator are increased. This leads to a reduction in the pressure in wafer handling chamber 100. A high reaction rate of the control system is preferably achieved via an oversized gas jet ventilator 140. Therefore, if necessary, large quantities of inert gas can be discharged from the wafer handling chamber within one second.

It is preferable for a limiter valve 170, which ensures a variable dynamic pressure, to be fitted in the off-gas line 102 of the wafer handling chamber 100, downstream of gas jet ventilator 140. Limiter valve 170 is designed, as a ball valve. This valve makes it possible to change the back pressure of gas jet ventilator 140, resulting in additional degrees of freedom, for optimization of the system. The optimum combination of parameters is preferably determined on a one-off basis and is kept constant as the method proceeds. This is also true of the setting of limiter valve 170.

Furthermore, it is preferable to use a bypass line 180 which bypasses the gas jet ventilator 140 and limiter valve 170. The capacity of bypass 180 is preferably adjusted by means of a bypass valve 182, for example a ball valve. Bypass line 180 is used to ensure a constant outgoing flow of inert gas from wafer handling chamber 100 into off-gas line 102 and thereby to allow threshold-free reaction of gas jet ventilator 140. Bypass line 180, like limiter valve 170, provides an additional degree of freedom to optimize the system. After optimization has taken place, the capacity of bypass line 180 is preferably kept constant. In addition, bypass line 180 ensures that gas jet ventilator 140 does not switch off even when a very low capacity is required. Gas jet ventilator 140 should be prevented from switching off, since there would be a sudden pressure change when it is switched on again. A gas feed line 112 is coupled to process chamber 110.

According to the invention, the measurement, evaluation, and pressure compensation take place at short intervals, but preferably continuously. This circuit process reacts very quickly to pressure changes in process chamber 110 and dynamically matches the pressure in wafer handling chamber 100 to the changes in process chamber 110. This ensures a constant pressure difference between wafer handling chamber 100 and process chamber 110.

The effect of the pressure regulation according to the invention is explained below with reference to examples and comparative examples:

COMPARATIVE EXAMPLE 1

Figure 3:
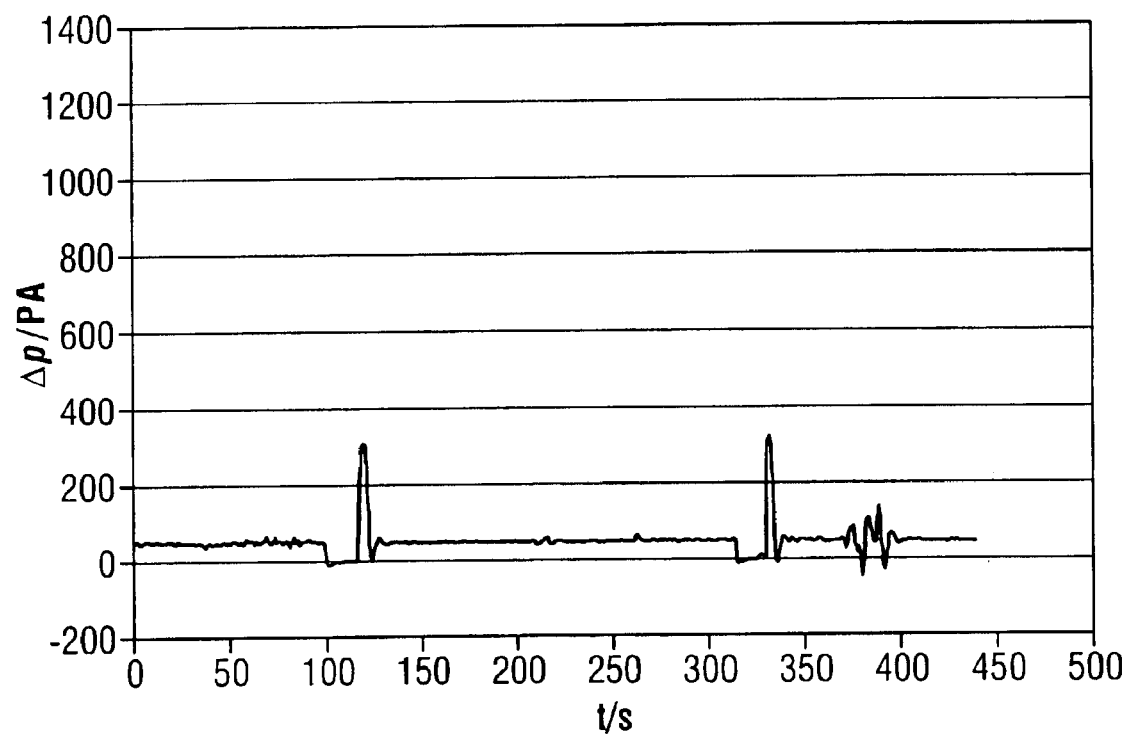
FIG. 3 illustrates a time curve of the pressure difference between the wafer handling chamber and the process chamber of an epitaxy reactor during an epitaxy process when a differential-pressure regulation is used.

Wafer handling chamber 100 is regulated to a constant excess pressure or positive pressure of approx. 2.0 kPa compared to the environment. This pressure is stabilized by a conventional backpressure regulator. FIG. 3 shows the time curve (time t in seconds) of the pressure difference $\Delta p = p_{WHC} - p_{PC}$ between the wafer handling chamber 100 and process chamber 110 during a typical epitaxy process. The pressure difference rises to approx. 1.2 kPa, then gate valve 120 is opened so that a semiconductor wafer can be transferred from wafer handling chamber 100 into process chamber 110. This results in an unfavorable pressure surge wherein $\Delta p$ is approx 0 kPa, which leads to particles being activated. After a short time, gate valve 120 is closed again, and the semiconductor wafer is disposed inside process chamber 110 for epitaxial coating. The pressure difference during the epitaxy process is approx. 0.36 kPa. The process is repeated when the semiconductor wafer is discharged from process chamber 110, wherein as the pressure difference rises, gate valve 120 is opened so that the semiconductor wafer can be removed and a pressure surge occurs once again. Then, gate valve 120 is closed, and process chamber 110 is made ready for the next semiconductor wafer.

EXAMPLE 1

The same epitaxy process as in Comparative Example 1 is carried out, except that the pressure in wafer handling chamber 100 is regulated in accordance with the invention via differential-pressure measurement, a control unit BO, and a gas jet ventilator 140. The preset pressure difference between wafer handling chamber and process chamber is 50 Pa. As shown in FIG. 4, this value is maintained with relatively minor fluctuations as long as the gate valve is closed. Even if the opening and closing of the gate valve remains clearly evident, nevertheless, a maximum pressure difference of approx. 0.3 kPa is not exceeded throughout the entire process. Consequently, the maximum pressure difference and therefore, also the pressure surge when the gate valve is opened are reduced to a quarter compared to the method shown in Comparative Example 1. This result is virtually independent of the pressure in the process chamber and therefore of the state of the off-gas system, such as in the off-gas scrubber. The result is that the pressure in process chamber 110 is lower than ambient pressure. This corresponds to the standard pressure conditions in epitaxy processes.

In principle, the system according to the invention can also be used to regulate the pressure difference between wafer handling chamber 100 and process chamber 110 so that the pressure in process chamber 110 is regulated instead of the pressure in the wafer handling chamber 100. However, since the pressure in process chamber 110 is subject to numerous conditions, for example, on account of the procedure used for the epitaxial coating, it is preferable to match the pressure of wafer handling chamber 100, which is not subject to any imperative external influences, to pressure of the process chamber 110.

The method according to the invention and the device according to the invention can be used in epitaxy reactors which are used, for example, for the epitaxial coating of semiconductor wafers, such as silicon wafers. However, it can in general terms be used wherever a constant pressure difference is to be set between two unsealed chambers or vessels.

Accordingly, while at least one embodiment of the present invention has been shown and described, it is to be understood that many changes and modifications may be made thereunto without departing from the spirit and scope of the invention as defined in the appended claims.

What is claimed is:

1. A method for regulating a pressure in an epitaxy reactor comprising a wafer handling chamber, a process chamber, a gate valve connecting the two chambers and a control circuit the method comprising the steps of:

a) continuously purging the wafer handling chamber with an inert gas;

b) measuring a pressure difference between the wafer handling chamber and the process chamber;

c) regulating said pressure in the wafer handling chamber based upon a measurement of the pressure difference between the wafer handling chamber and the process chamber using the control circuit;

d) reducing said pressure in the wafer handling chamber if the pressure difference between the wafer handling chamber and the process chamber is above a predetermined value;

e) increasing said pressure in the wafer handling chamber if said pressure difference between the wafer handling chamber and the process chamber is below said predetermined value, wherein said predetermined pressure difference is between 5 and 500 Pa.

2. The method in claim 1, wherein said step of regulating said pressure in the wafer handling chamber is based upon a predetermined pressure difference of between 10 and 100 Pa.

3. The method as in claim 1, wherein said step of regulating said pressure difference in the wafer handling chamber includes sending a measurement signal to regulate a suction pump which removes the inert gas out of the wafer handling chamber, wherein this step includes increasing said suction pump capacity if said pressure difference is above said predetermined value, and wherein said capacity of said suction pump is reduced if said pressure difference is below said predetermined value.

4. The method as in claim 3, wherein said step of regulating said suction pump includes a step of determining a suction capacity of said suction pump which is in the form of a gas jet ventilator, wherein said capacity is determined by an inert gas stream which is adjusted via a regulating valve and regulated by the control circuit.

5. The method as in claim 4, further comprising the step of limiting the gas stream delivery from said suction pump via a downstream limiter valve.

6. The method as in claim 5, wherein said step of regulating the pressure in the wafer handling chamber includes discharging a portion of the gas from the wafer handling chamber past said suction pump via a bypass line.

7. A device for regulating a pressure in an epitaxy reactor, wherein the reactor comprises a wafer handling chamber, a process chamber, and a gate valve connecting the wafer handling chamber with the process chamber, said device comprising:
  a) at least one wafer handling gas feed line coupled to the wafer handling chamber;
  b) at least one process chamber gas feed line coupled to the process chamber);
  c) at least one wafer handling chamber gas discharge line coupled to the wafer handling chamber;
  d) at least one process chamber gas discharge line coupled to the process chamber;
  e) at least one pressure monitoring sensor in communication with the wafer handling chamber and the process chamber for measuring a pressure difference between said wafer handling chamber and said pressure chamber; and
  f) at least one control circuit coupled to said at least one wafer handling chamber gas discharge line, wherein said at least one control circuit regulates a pressure in said wafer handling chamber, and wherein said wafer handling chamber is continuously purged with an inert gas via said wafer handling chamber gas feed line;

wherein said pressure difference between the wafer handling chamber and the process chamber is measured by said pressure monitoring sensor;

wherein said at least one control circuit regulates said pressure in the wafer handling chamber via a measurement signal which is used in said at least one control circuit so as to reduce said pressure in the wafer handling chamber if a pressure difference between the wafer handling chamber and the process chamber is above a predetermined value, or to increase said pressure in the wafer handling chamber if said pressure difference between the wafer handling chamber and the process chamber is below said predetermined value; and wherein said predetermined pressure difference is between 5 and 500 Pa.

8. The device as in claim 7, further comprising a suction pump in communication with said control circuit, wherein said suction pump determines a level of flow of discharge gas which is discharged from the wafer handling chamber.

9. The device as in claim 8, wherein said suction pump is a gas jet ventilator having a suction capacity which is determined by an inert gas stream; and wherein said device further comprises a regulating valve in communication with said control circuit for controlling said inert gas stream which is regulated by said control circuit.

10. The device as in claim 9, further comprising a limiter valve which is connected downstream of said gas jet ventilator and limits a gas stream which is delivered by said gas jet ventilator, wherein said device further comprises a bypass line which is coupled to said wafer handling chamber gas discharge line, and wherein at least some of said off gas which is discharged from said wafer handling chamber is guided past said gas jet ventilator and said limiter valve.

* * * * *